United States Patent
Breed

(10) Patent No.: US 9,563,723 B1
(45) Date of Patent: Feb. 7, 2017

(54) GENERATION OF AN OBSERVER VIEW IN A VIRTUAL ENVIRONMENT

(71) Applicant: Lockheed Martin Corporation, Bethesda, MD (US)

(72) Inventor: Adam R. Breed, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 370 days.

(21) Appl. No.: 13/663,932

(22) Filed: Oct. 30, 2012

Related U.S. Application Data

(60) Provisional application No. 61/553,201, filed on Oct. 30, 2011.

(51) Int. Cl.
  *G06G 7/48* (2006.01)
  *G06F 17/50* (2006.01)

(52) U.S. Cl.
  CPC ................ *G06F 17/5009* (2013.01)

(58) Field of Classification Search
  CPC ........ A63F 13/798; A63F 13/86; H04L 67/24; F41G 3/26; G09B 9/00; G09B 9/003; G09B 7/02; H04N 21/4307; H04N 21/43
  USPC ....... 703/6, 8, 7; 345/419, 424, 473; 434/11, 434/16; 463/42
  See application file for complete search history.

(56) References Cited

U.S. PATENT DOCUMENTS

| | | | |
|---|---|---|---|
| 7,789,741 B1* | 9/2010 | Fields | A63F 13/10 463/2 |
| 8,126,838 B2* | 2/2012 | Stone et al. | 706/62 |
| 2003/0220143 A1* | 11/2003 | Shteyn et al. | 463/42 |
| 2006/0058103 A1* | 3/2006 | Danieli et al. | 463/42 |
| 2006/0183083 A1* | 8/2006 | Moran et al. | 434/11 |
| 2007/0117635 A1* | 5/2007 | Spanton et al. | 463/43 |
| 2007/0236502 A1* | 10/2007 | Huang et al. | 345/473 |
| 2007/0287133 A1* | 12/2007 | Schubert et al. | 434/11 |
| 2008/0108021 A1* | 5/2008 | Slayton et al. | 434/16 |
| 2009/0099824 A1* | 4/2009 | Falash et al. | 703/8 |
| 2009/0138138 A1 | 5/2009 | Ferren et al. | |
| 2009/0208181 A1* | 8/2009 | Cottrell | 386/52 |
| 2010/0194746 A1 | 8/2010 | Barbina et al. | |

(Continued)

OTHER PUBLICATIONS

Filiagos, D.E., Developing an After Action Review System for a 3D Interactive Training Simulation Using XML, NAVAL POSTGRADUATE SCHOOL, 2004.*

(Continued)

*Primary Examiner* — Aniss Chad
*Assistant Examiner* — Scott S Cook
(74) *Attorney, Agent, or Firm* — Withrow & Terranova, PLLC

(57) ABSTRACT

Generation of an observer view in a virtual environment in response to real-time input during a simulation is disclosed. In one embodiment, a device initiates a simulation of a virtual environment. Core view data that identifies a core view in the virtual environment is maintained. The core view is associated with an object in the virtual environment. Core view imagery that depicts a portion of the virtual environment based on the core view data is generated. During the simulation, real-time input that includes first observer view data that identifies a first observer view in the virtual environment is received. The first observer view is unassociated with any object in the virtual environment. First observer view imagery that depicts a portion of the virtual environment based on the first observer view data is generated.

15 Claims, 9 Drawing Sheets

(56) References Cited

U.S. PATENT DOCUMENTS

| | | | |
|---|---|---|---|
| 2010/0203952 A1* | 8/2010 | Zalewski | 463/23 |
| 2010/0240459 A1* | 9/2010 | Shelton | 463/42 |
| 2010/0266991 A1 | 10/2010 | Gregoire et al. | |
| 2010/0292874 A1 | 11/2010 | Duggan et al. | |
| 2011/0003271 A1 | 1/2011 | Grant et al. | |
| 2011/0013087 A1* | 1/2011 | House et al. | 348/564 |
| 2011/0090149 A1 | 4/2011 | Larsen et al. | |
| 2011/0128348 A1 | 6/2011 | Theobald | |

OTHER PUBLICATIONS

Bush, A., It's All a Matter of Your Perspective—Part One, SimHQ, May 11, 1999 http://www.simhq.com/_air/air_020a.html.*

Weil, S.A., The Use of Massively Multi-Player Gaming Technology for Military Training: A Preliminary Evaluation, Proceedings of the Human Factors and Ergonomics Society 49th Annual Meeting—2005.*

Adams, C.E., Virtual Strike Warefare Environment (VSWE) 9+Event, Proceedings of the 2003 User Group Conference (DoD_UGC'03).*

Domeshek, E.A., Phase II Final Report on an Intelligent Tutoring System for Teaching Battlefield Command Reasoning Skills, Technical Report 1143, 2004.*

Endsley, M.R., Situation Awareness Analysis and Measurement, Taylor & Francis e-Library 2009.*

DAS, The Virtual Interactive Combat Environment, http://web.archive.org/web/20111123181715/http://www.d-a-s.com/VICE.*

Meliza, L.L., After Action Review in Simulation-Based Training, RTO-TR-HRM-121-Part-II, 2007.*

Mininday, T.J., Divide Your PC Monitor Into Multiple Screens With WinSplit Revolution, Apr. 15, 2009, http://www.makeuseof.com/tag/divide-your-pc-monitor-into-multiple-screens-with-winsp. . .*

Colucci, F., 'Such A Capable Helmet' Avionics Magazine, Thursday, Jul. 1, 2010 downloaded from: http://www.aviationtoday.com/av/issue/cover/Such-A-Capable-Helmet_68788.html.*

Ferreira, Alexandre et al., "Multiple Display Viewing Architecture for Virtual Environments over Heterogeneous Networks", Proceedings of XII SIBGRAPI, Oct. 1999, pp. 1-10, Rio de Janeiro, Brazil.

Michel, Daniel et al., "A Multiresolution Synthetic Environment Based on Observer Viewpoints", Proceedings of the 15th DIS Workshop, 1996, Massachusetts Institute of Technology, Cambridge, MA, USA.

* cited by examiner

GENERATION OF AN OBSERVER VIEW IN A VIRTUAL ENVIRONMENT

RELATED APPLICATIONS

This application claims the benefit of provisional patent application Ser. No. 61/553,201, filed Oct. 30, 2011, the disclosure of which is hereby incorporated herein by reference in its entirety.

TECHNICAL FIELD

The embodiments relate generally to simulations of virtual environments, and in particular to the generation of an observer view in a virtual environment in response to real-time input during a simulation.

BACKGROUND

A simulation of a virtual environment typically presents a view of the virtual environment to a participant of the simulation. The view may be from the perspective of an object in the virtual environment that represents the participant, such as an entity that moves about the virtual environment in response to input from the participant, or the view may be from the perspective of an object in the virtual environment with which the participant is associated, such as a car, airplane, or the like.

Sometimes it is desirable to generate an additional view in the virtual environment that is not tied to an object in the virtual environment during a simulation. This may be referred to herein as an observer view. An observer view may provide a participant of the simulation a view of the virtual environment that differs from the view of the virtual environment the participant has by virtue of participating in the virtual environment.

Unfortunately, it may be difficult or impossible to know, prior to the initiation of the simulation, where in the virtual environment such an observer view may be useful. Accordingly, there is a need for flexible mechanisms for initiating observer views in a virtual environment based on real-time input received during a simulation.

SUMMARY

Embodiments herein relate to the generation of one or more observer views in a virtual environment during a simulation of the virtual environment. In one embodiment, a device initiates a simulation of a virtual environment. Core view data that identifies a core view in the virtual environment is maintained. The core view is associated with an object in the virtual environment. Core view imagery that depicts a portion of the virtual environment based on the core view data is generated. During the simulation, real-time input that includes first observer view data that identifies a first observer view in the virtual environment is received. The first observer view is unassociated with any object in the virtual environment. First observer view imagery that depicts a portion of the virtual environment based on the first observer view data is generated.

In one embodiment, the core view imagery may be displayed on a display device in a first window, and the first observer view imagery may be concurrently displayed on the display device in a second window.

In one embodiment, a simulation module may expose an application programming interface (API) that is configured to receive data for generating an observer view from an external application that is independent of and external to the simulation module. The input that includes the first observer view data that identifies the first observer view in the virtual environment may be received via the API from the external application.

In one embodiment, the device may receive, during the simulation, a plurality of different real-time inputs, each different real-time input including corresponding observer view data that may identify a corresponding observer view in the virtual environment. Each corresponding observer view may be different from each other corresponding observer view and be different from the core view. A plurality of observer view imagery may be generated, each observer view imagery corresponding to one of the corresponding observer views and depicting a portion of the virtual environment based on the corresponding observer view. The core view imagery may be displayed on a display device in a first window. The plurality of observer view imagery may be concurrently displayed on the display device, wherein each observer view imagery is displayed in a separate window on the display device.

Those skilled in the art will appreciate the scope of the embodiments and realize additional aspects thereof after reading the following description of the embodiments in association with the accompanying drawing figures.

BRIEF DESCRIPTION OF THE DRAWINGS

The accompanying drawings incorporated in and forming a part of this specification illustrate several aspects of the embodiments, and together with the description serve to explain the principles of the embodiments.

DETAILED DESCRIPTION

The embodiments set forth below represent the necessary information to enable those skilled in the art to practice the embodiments and illustrate the best mode of practicing the embodiments. Upon reading the following description in light of the accompanying drawings, those skilled in the art will understand the concepts of the embodiments and will recognize applications of these concepts not particularly addressed herein. It should be understood that these concepts and applications fall within the scope of the embodiments and the accompanying claims.

Figure 1:
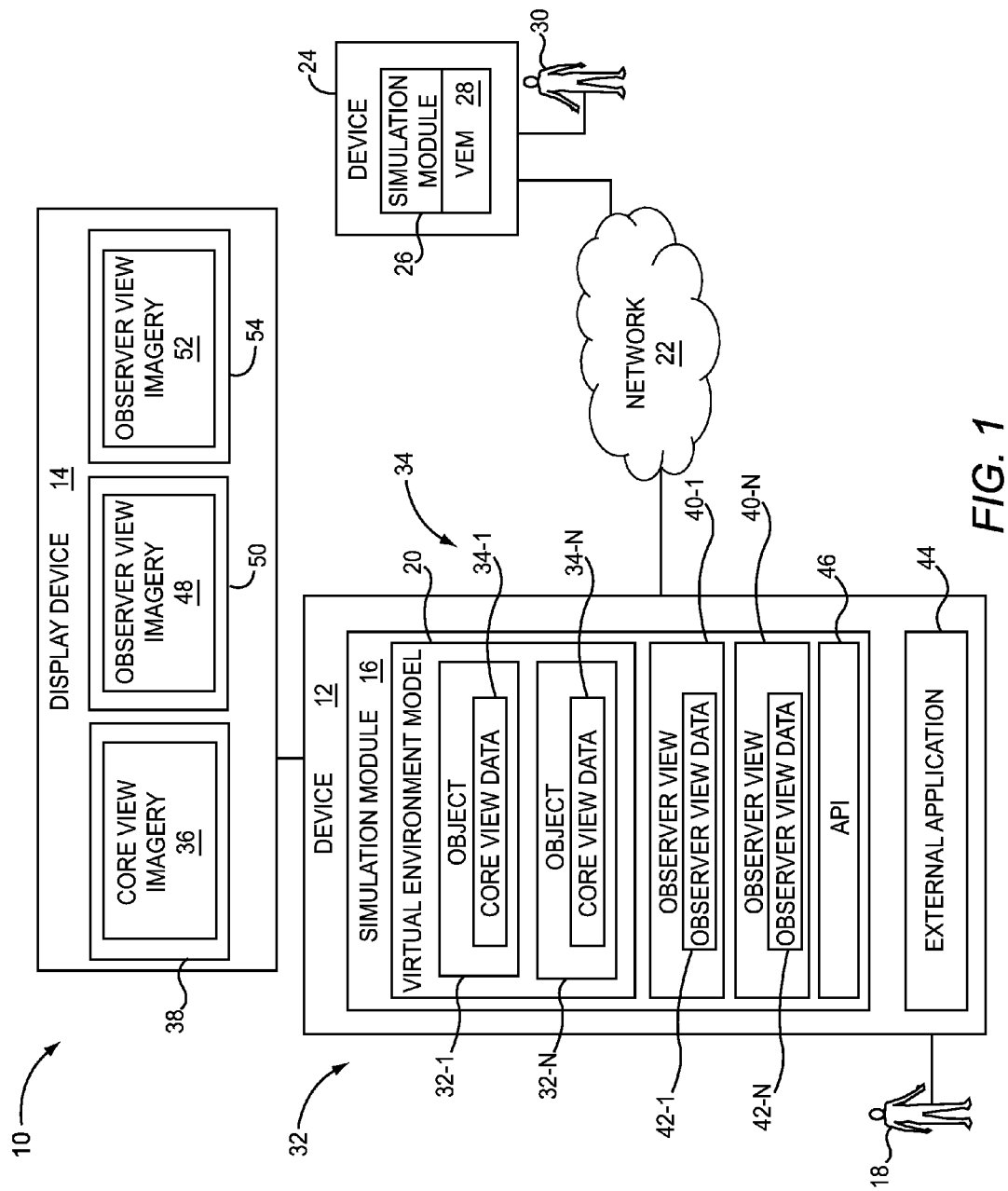
FIG. 1 is a block diagram of a system in which embodiments may be practiced according to one embodiment.

FIG. 1 is a block diagram of a system 10 in which embodiments may be practiced according to one embodiment. The system 10 includes a device 12 that is communicatively coupled to a display device 14. The display device 14 may be a separate device from the device 12, such as one or more monitors that are coupled to the device 12, or may be integrated with the device 12. The device 12 includes a simulation module 16 which is configured to provide a simulation of a virtual environment to one or more users 18. The virtual environment may be in part or in whole defined by a virtual environment model (VEM) 20 that comprises one or more data structures that identify attributes of the virtual environment, such as information regarding each object in the virtual environment, including the spatial relationships of objects in the virtual environment, locations of the objects in the virtual environment, attributes and characteristics of the objects in the virtual environment, graphical information, and the like.

The VEM 20 may be continually updated during the simulation and reflects a current status of the virtual environment. Imagery may be generated, based on the VEM 20, that depicts portions of the virtual environment and that may be displayed, by way of non-limiting example, on the display device 14. In some embodiments, the device 12 may be coupled to a network 22 to facilitate communications with one or more other devices 24 that are concurrently involved in the simulation. Such device 24 may include a simulation module 26 which may also maintain a VEM 28 that may reflect the current state of the virtual environment. As the simulation progresses, the device 12 and the device 24 may exchange data that facilitates synchronization of the VEM 20 with the VEM 28 so that the users 18 and 30 of the devices 12 and 24, respectively, may perceive substantially identical virtual environments. For example, as the user 18 manipulates an input device (not illustrated) to move an object in the virtual environment about the virtual environment, positional data identifying such object movements may be provided by the device 12 to the device 24 via the network 22 so the VEM 28 may be updated to correctly identify a current position of the object in the virtual environment. Accordingly, the simulation module 16 may render imagery to the user 30 substantially in real-time that depicts the movements of the object that is being manipulated by the user 18. Similarly, the user 30 may also manipulate an object in the virtual environment, and the device 24 may send positional data identifying such object movements to the device 12 via the network 22 so the VEM 20 may be updated to correctly identify a current position of such object in the virtual environment. While for purposes of illustration only two devices are shown as participating in the simulation, any number of devices may participate in a simulation.

The VEM 20 may maintain data regarding a plurality of objects 32-1-32-N (generally, objects 32) that are part of the virtual environment. An object 32 may represent any entity or thing that is part of the virtual environment, such as, by way of non-limiting example, a vehicle, a tree, or an animal. Typically, each human participant in the simulation may be represented as an object in the virtual environment, and may be a particular type of object based on the particular simulation, such as a human object, a car object, or the like.

All or some of the plurality of objects 32-1-32-N may have associated core view data 34-1-34-N (generally, core view data 34) that may identify a core view in the virtual environment. The core view data 34 may comprise, for example, information that identifies a portion of the virtual environment, such as a volume in the virtual environment, that may be perceivable by the corresponding object 32. The core view data 34 may include, by way of non-limiting example, a location identifier that identifies a location within the virtual environment, a view direction identifier that identifies a view direction in the virtual environment with respect to the location, a horizontal field-of-view (FOV) identifier that identifies a horizontal FOV, and a vertical FOV identifier that identifies a vertical FOV.

The simulation module 16 may render core view imagery for display on the display device 14 based on the core view data 34. For example, assume that the user 18 is represented in the virtual environment by the object 32-1. The object 32-1 may comprise, by way of non-limiting example, a simulated human in the virtual environment. Thus, as the user 18 manipulates an input device, such as a keyboard, joystick, or other input device, the simulation module 16 may translate such manipulations into movements of the object 32-1 in the virtual environment. The simulation module 16, based on the core view data 34-1, may render, or may otherwise generate, imagery, referred to herein as core view imagery to distinguish such imagery from observer view imagery discussed below, and may display core view imagery 36 in a first window 38 on the display device 14. The core view imagery 36 may depict the portion of the virtual environment that is within the core view defined by the core view data 34-1. As the user 18 manipulates the input device, such manipulations may change the location of the object 32-1 in the virtual environment, and/or the view direction of the object 32-1, and thus, the core view data 34-1 may change in accordance with such manipulations. The simulation module 16 may continually render new imagery based on the updated core view data 34-1, providing the user 18 a real-time view of the virtual environment that changes in response to manipulations of the object 32-1.

As will be discussed in greater detail herein, the simulation module 16 may also maintain one or more observer views 40-1-40-N (generally, observer views 40), each of which is identified via corresponding observer view data 42-1-42-N (generally, observer view data 42). An observer view 40, in contrast to a core view, is unassociated with any object 32 in the virtual environment. The observer view data 42 may include information such as, by way of non-limiting example, an observer view location identifier that identifies a location within the virtual environment, a view direction identifier that identifies a view direction in the virtual environment with respect to the location, a horizontal field-of-view identifier that identifies a horizontal field-of-view, and a vertical field-of-view identifier that identifies a vertical field-of-view.

The observer views 40 may be generated in response to real-time input received during the simulation. Such information may be received, for example, via real-time input entered by a user, such as the user 18. In some embodiments, the simulation module 16 may interact with one or more external applications 44, and may receive real-time input that may include observer view data from such external application 44. The phrase "external application" is used herein to refer to a process that may execute in conjunction with a processor, and is initiated separately from and independent of the simulation module 16. The external application 44 may execute on the same device 12 as the simulation module 16, or, as will be described in greater detail herein, may execute on a different device that is communicatively coupled to the device 12.

In one embodiment, the simulation module 16 may interact with the external application 44 by exposing to the external application 44 an application programming interface (API) 46 that is configured to receive data for generating an observer view 40. Thus, during runtime, the external application 44 may interface with the simulation module 16 via the API 46 and interact with the simulation module 16 to generate, define, update, and/or delete one or more observer views 40. It should be noted that the embodiments are not limited to the use of an API, and other inter-process communication mechanisms may be used.

The simulation module 16 may generate observer view imagery that depicts a portion of the virtual environment that is within the observer view 40 defined by the corresponding observer view data 42. For example, observer view imagery 48 associated with the observer view 40-1 may be displayed in a second window 50 on the display device 14. Observer view imagery 52 associated with the observer view 40-N may be displayed in a third window 54 on the display device 14. Notably, the core view imagery 36, observer view imagery 48, and observer view imagery 52 may all be concurrently displayed on the display device 14, such that the user 18 has three simultaneous, different views of the virtual environment.

Figure 2:
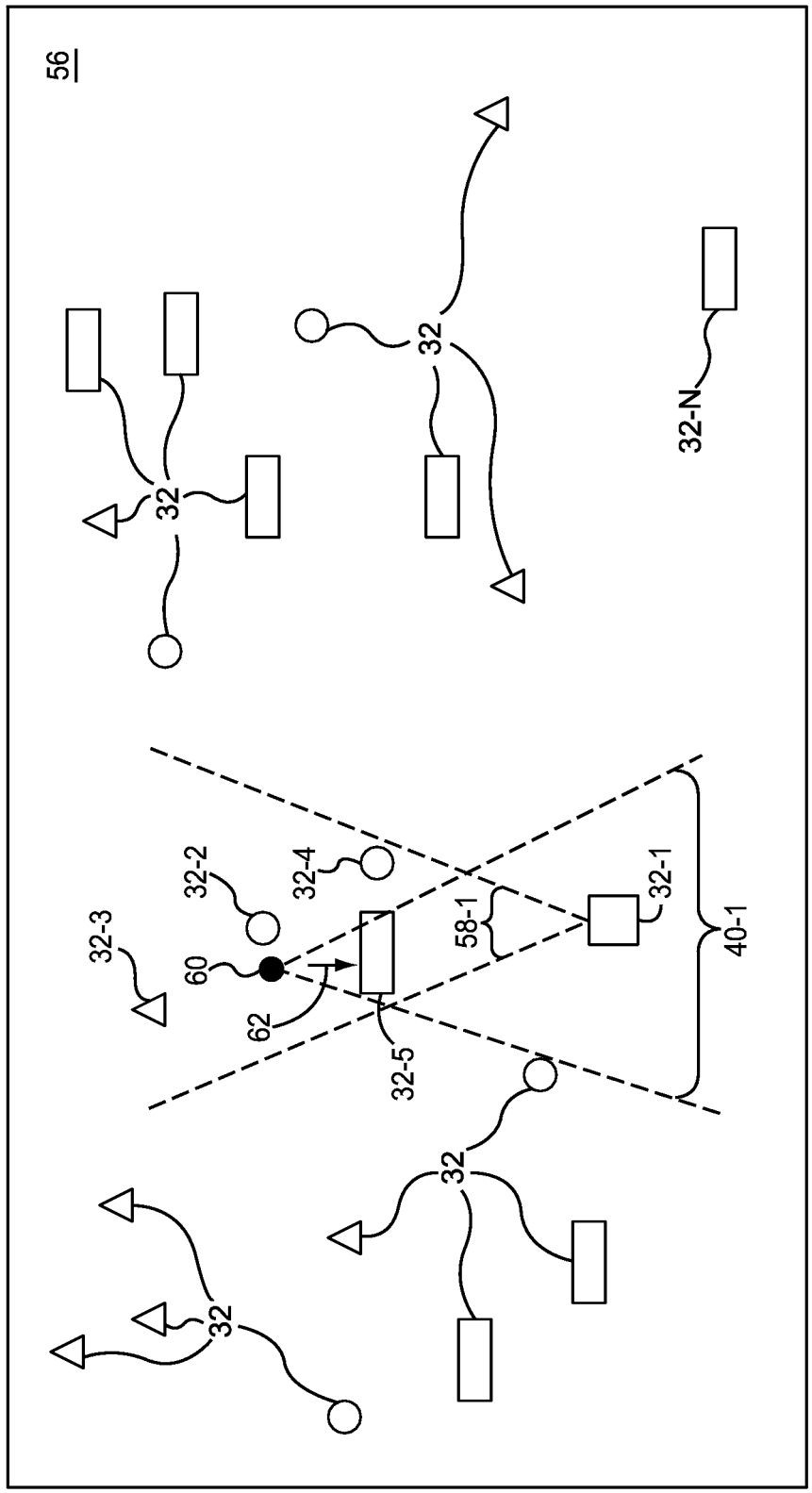
FIG. 2 is a plan view of a representation of a virtual environment at a particular instant in time according to one embodiment.

FIG. 2 is a plan view of a representation of a virtual environment 56 at a particular instant in time according to one embodiment. While for purposes of illustration the virtual environment 56 is shown in two-dimensions, the virtual environment 56 is, in one embodiment, a three-dimensional virtual environment 56, and thus, the objects 32 may have locations identified with respect to a three-dimensional coordinate system. The virtual environment 56 is defined, as discussed previously, by the VEM 20 (FIG. 1). The virtual environment 56 may include a plurality of objects 32, 32-1-32-N. Certain of the objects 32, such as the object 32-1, may have associated core view data 34-1 (FIG. 1) that identifies a corresponding core view 58-1 in the virtual environment 56. For purposes of illustration, the portion of the virtual environment 56 within the core view 58-1 is identified via dashed lines. Accordingly, the object 32-1 can "see" the objects 32-2-32-5, but not the object 32-N, or other objects 32 that are not within the core view 58-1.

FIG. 2 also illustrates an observer view 40-1, shown via dashed lines. The observer view 40-1 originates from a location 60 and extends in a direction 62. Thus, at the instant in time illustrated by FIG. 2, the objects 32-1 and 32-5 are within the observer view 40-1, and observer view imagery depicting the observer view 40-1 would depict the current state of the objects 32-1 and 32-5. Notably, the location 60 is within the core view 58-1 of the object 32-1, but core view imagery depicting the core view 58-1 does not depict the observer view 40-1 or any other information regarding the observer view 40-1, because the observer view 40-1 is unassociated with any object 32 in the virtual environment 56 and thus is not perceivable by the object 32-1.

A core view 58 and an observer view 40 may be defined in any desirable manner, and in some embodiments, the same type of information may be used to define either a core view 58 or an observer view 40. In one embodiment, a core view 58 and an observer view 40 may be defined via a view frustum.

Figure 3:
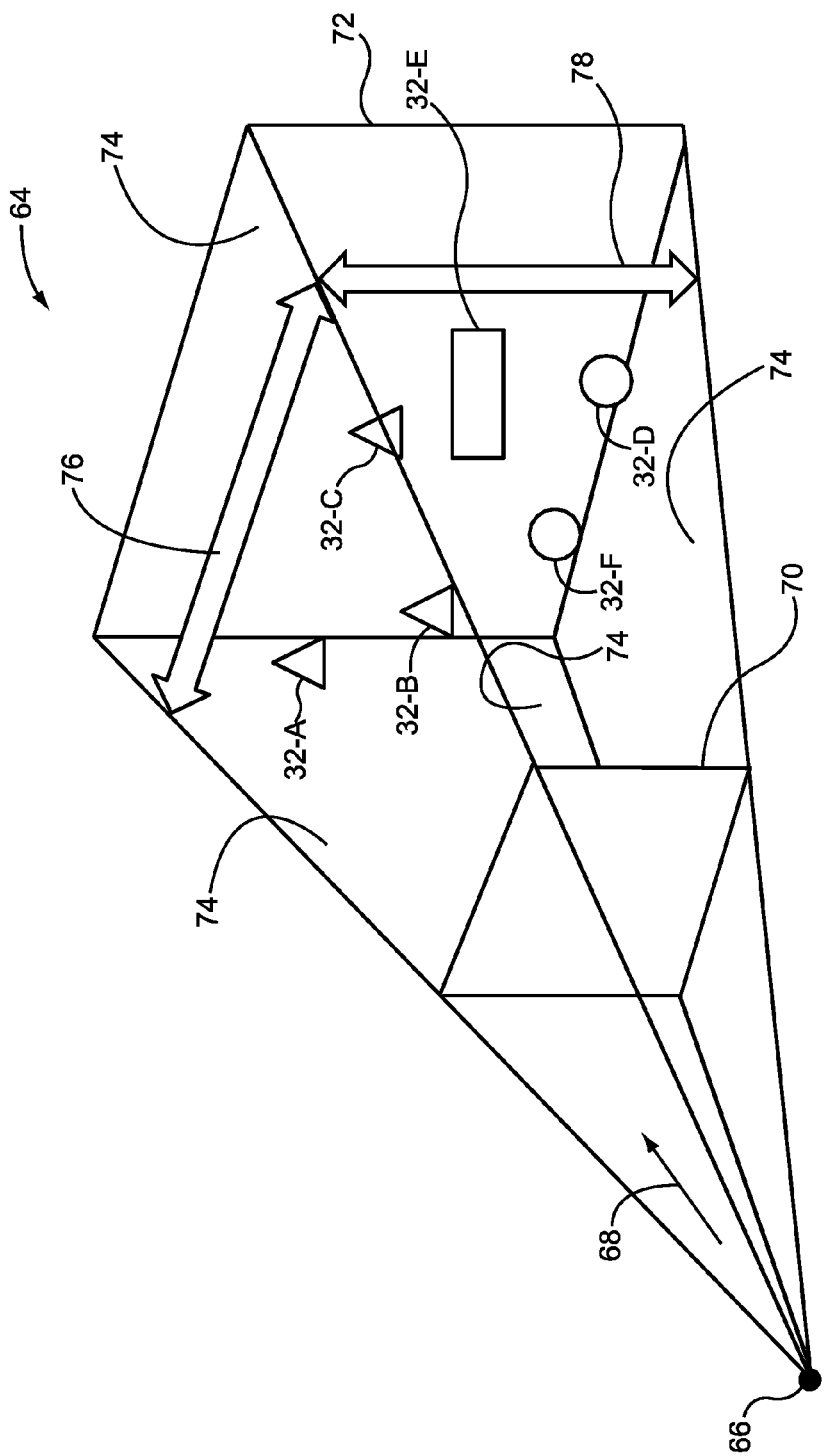
FIG. 3 is a block diagram illustrating a view frustum according to one embodiment, and a plurality of objects in the virtual environment.

FIG. 3 is a block diagram illustrating a view frustum 64 according to one embodiment, and a plurality of objects 32-A-32-F in the virtual environment 56. The view frustum 64 originates from a location 66 that is identified by an observer view location identifier. The location 66 is typically a particular location in the virtual environment 56. For a core view 58, the location is associated with a corresponding object 32. For an observer view 40, the location is unassociated with any object 32 in the virtual environment 56.

The view frustum 64 may extend in a view direction 68, which may be defined by a view direction identifier. The view frustum 64 may include a near plane 70, a far plane 72, and top, right, bottom, and left planes 74 that define a volume of the virtual environment 56. The top, right, bottom, and left planes 74 may be defined, for example, via a horizontal field of view (FOV) 76 which is identified by a horizontal FOV identifier and a vertical FOV 78 which is identified by a vertical FOV identifier. The horizontal FOV identifier and the vertical FOV identifier may define the respective FOVs in terms of degrees, for example. For a core view 58, the view frustum 64 may be identified in the corresponding core view data 34. For an observer view 40, the view frustum 64 may be identified in the corresponding observer view data 42.

In one embodiment, in operation, to generate and display core view imagery associated with a core view 58, the simulation module 16 accesses the core view data 34, intersects the VEM 20 with the view frustum defined by the core view data 34, and that portion of the virtual environment that, according to the VEM 20 is within the volume of the view frustum, may be rendered and displayed. In this example, at a particular instance in time, that portion of the virtual environment may include objects 32-A-32-F. This process may be repeated many times each second so that changes in the virtual environment may be displayed substantially in real-time as such changes occur. The process may be similar for displaying observer view imagery associated with an observer view 40.

Figure 4:
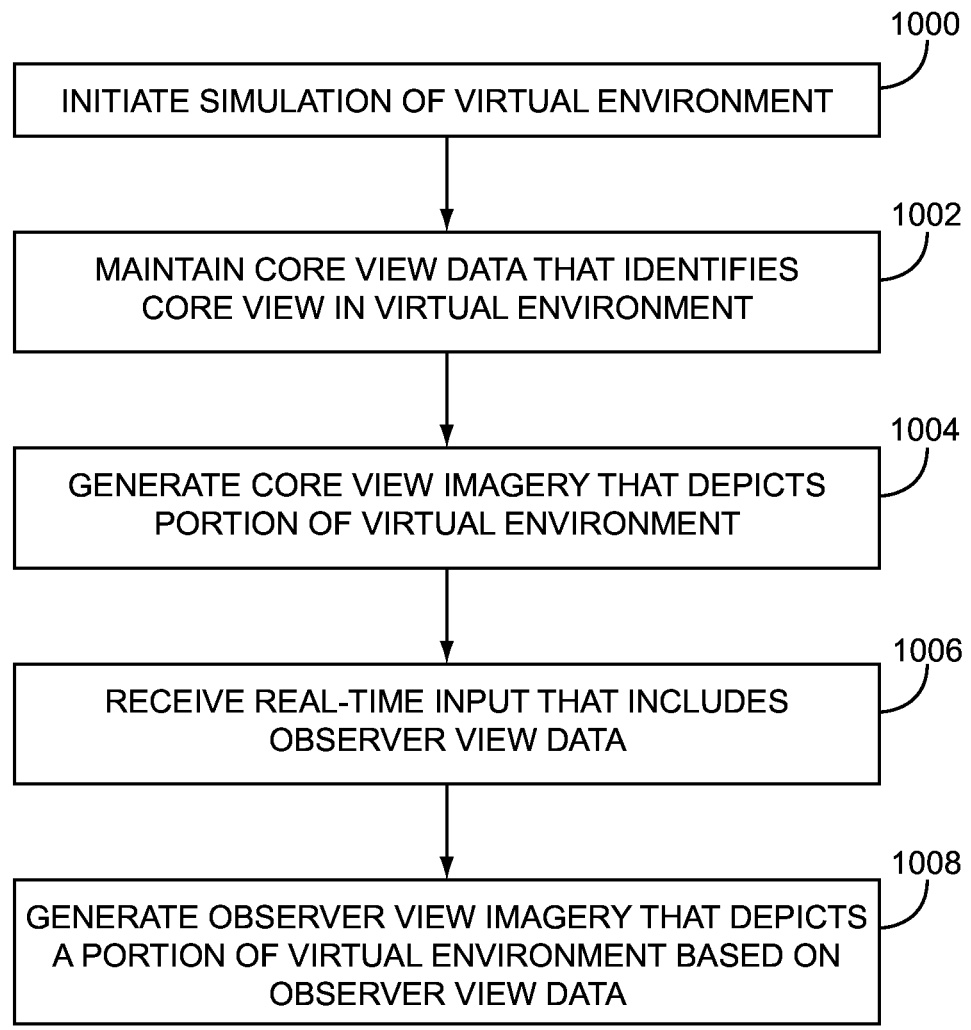
FIG. 4 is a flowchart of a process for generating an observer view in a virtual environment in response to real-time input during a simulation according to one embodiment.

FIG. 4 is a flowchart of a process for generating an observer view in a virtual environment in response to real-time input during a simulation according to one embodiment. FIG. 4 will be discussed in conjunction with FIG. 1. The device 12 initiates a simulation of the virtual environment by, for example, initiating the simulation module 16 (FIG. 4, step 1000). During the simulation, the simulation module 16 maintains the core view data 34 that identifies a core view in the virtual environment (FIG. 4, step 1002). The core view is associated with an object 32 in the virtual environment. The device 12 generates core view imagery 36 that depicts a portion of the virtual environment based on the core view data 34 (FIG. 4, step 1004). The device 12 may receive, during the simulation, real-time input that includes first observer view data 42-1 that identifies a first observer view 40-1 in the virtual environment (FIG. 4, step 1006). The first observer view 40-1 is unassociated with any object 32 in the virtual environment.

As discussed above, the real-time input may come, for example, from the user 18. In one embodiment, the user 18 may enter such real-time input into the external application 44, which may provide the observer view data 42-1 to the simulation module 16 via the API 46. The device 12 may generate observer view imagery 48 that depicts a portion of the virtual environment based on the observer view data 42-1 (FIG. 4, step 1008).

The device 12 may display the core view imagery 36 in a first window 38 and concurrently display the observer view imagery 48 in the second window 50. In one embodiment, the first observer view data 42-1 may include a location identifier that identifies a location within the virtual environment, a view direction identifier that identifies a view direction in the virtual environment, a horizontal FOV identifier that identifies a horizontal FOV and a vertical FOV identifier that identifies a vertical FOV.

In one embodiment, the user 18 may provide updated real-time input that alters one or more of the observer view data 42-1. The external application 44 may provide the updated real-time input via the API 46 to the simulation module 16. For example, the updated real-time input may include a different observer view location identifier that differs from the first observer view location identifier provided by the user 18. In response to receiving the updated observer view location identifier, the device 12 may alter the observer view 40-1 based on the second observer view location identifier to generate an altered observer view 40-1. The device 12 may generate new observer view imagery 48 that may depict a second portion of the virtual environment based on the updated observer view data 42-1.

Figure 5:
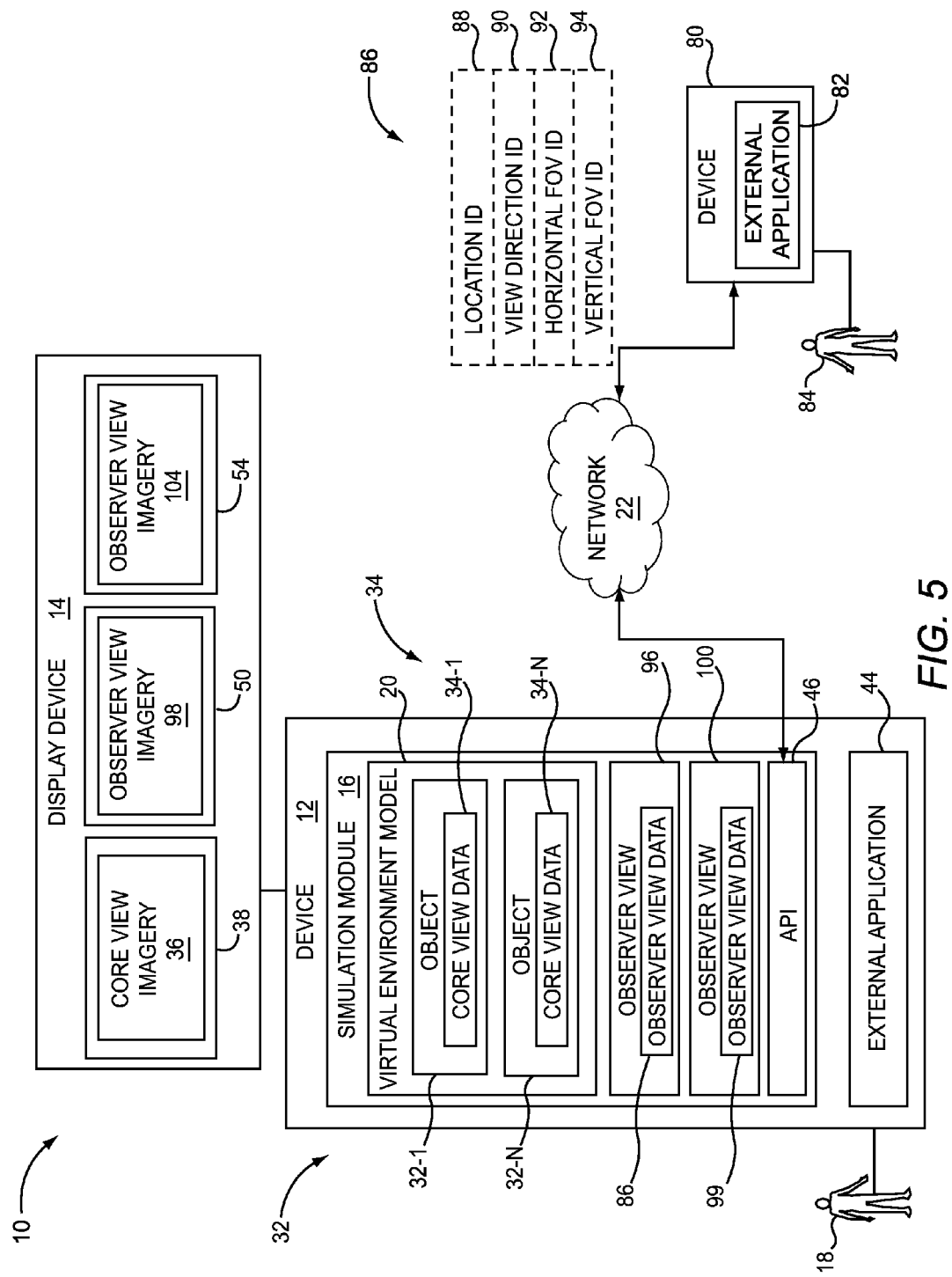
FIG. 5 is a block diagram of the system according to another embodiment.

FIG. 5 is a block diagram of the system 10 according to another embodiment. In this embodiment, a device 80 may be communicatively coupled to the device 12 via the network 22. The device 80 may include an external application 82. The external application 82 is independent of and external to the simulation module 16, but may be capable of communicating with, or interacting with, the simulation module 16 via the API 46. In one embodiment, the external application 82 may offer a user interface (not illustrated) to a user 84 of the device 80. The user 84 may enter via the user interface real-time input that includes observer view data 86 that identifies an observer view in the virtual environment. The observer view data 86 may include, for example, an observer view location identifier (ID) 88 that identifies a location within the virtual environment, a view direction ID 90 that identifies a view direction in the virtual environment with respect to the location, a horizontal FOV ID 92 that identifies a horizontal FOV, and a vertical FOV ID 94 that identifies a vertical FOV.

The API 46 may comprise any one or more function calls, method invocations, or other functional programming modules for defining, modifying and deleting an observer view. In one embodiment, the API 46 may include the following functions:

DefineProcess( ):
  Invocation of this function by the external application 82 may set an indented thread that processes subsequent API 46 calls by the external application 82;

OpenConnection( ):
  Invocation of this function by the external application 82 may close the connection to the simulation module 16;

InitializeClientEventHandler( ):
  Invocation of this function by the external application 82 may initiate an event handler via which the external application 82 may receive system events;

OnReceiveOpen( ):
  This function may be invoked when the external application 82 connects to the simulation module 16;

OnReceiveQuit( ):
  This function may be invoked when the simulation module 16 exits or otherwise terminates;

OnReceiveObserverData( ):
  This function may provide the external application 82 a data structure that defines a respective observer view;

CreateObserver( ):
  Invocation of this function by the external application 82 may create an observer view;

RequestObserverData( ):
  Invocation of this function by the external application 82 may result in the receipt of the observer view data associated with an identified observer view;

MoveObserver( ):
  Invocation of this function by the external application 82 may result in the movement of the observer view a predetermined distance;

RotateObserver( ):
  Invocation of this function by the external application 82 may result in the rotation of the observer view a predetermined amount;

SetObserverPosition( ):
  Invocation of this function by the external application 82 may set the location of the observer view in the virtual environment;

SetObserverRotation( ):
  Invocation of this function by the external application 82 may set a rotation of the observer view in the virtual environment;

SetObserverLookAt( ):
  Invocation of this function by the external application 82 may set an angle of the observer view;

SetObserverFieldOfView( ):
  Invocation of this function by the external application 82 may set a FOV of the observer view;

SetObserverStepSize( ):
  Invocation of this function by the external application 82 may set the distance of a "step" of the observer view in response to a user manipulation of an input device;

SetObserverFocalLength( ):
  Invocation of this function by the external application 82 may set the focus of the observer view;

SetObserverFocusFixed( ):
  Invocation of this function by the external application 82 may set whether focus of the observer view is fixed or relative;

SetObserverRegime( ):
  Invocation of this function by the external application 82 may set whether the observer view may view through water/land;

SetObserverZoomLevels( ):
  Invocation of this function by the external application 82 may set a zoom level of the observer view.

In some embodiments, data that may be utilized to construct an observer view includes:
  Position (Latitude, Longitude, Altitude, or X, Y, Z)
  Target (Position)
  Rotation (Yaw, Pitch, Roll)
  LeftVector (Vector)
  RightVector (Vector)
  UpVector (Vector)
  ForwardVector (Vector)
  RelativeAxes (Position)
  RotationOrigin (Position)
  RotationAxes (Position)
  Regime (Enumeration)
  FocusType (Enumeration)
  Pitch (Float)
  FocalLength (Float)
  HorizontalFieldOfView (Float)
  VerticalFieldOfView (Float)
  AspectRatio (Float)
  ZoomLevel (Float)
  MaxZoomLevel (Float)
  ZoomTable (Structure)

InfiniteFocus (Boolean)
CheckElevation (Boolean)
RecomputeTarget (Boolean)

The external application 82 provides the observer view data 86 to the API 46 of the simulation module 16 via the network 22. The simulation module 16, in response to receiving the observer view data 86, may generate an observer view 96 based on the observer view data 86. The simulation module 16 may then generate observer view imagery 98 that depicts a portion of the virtual environment based on the observer view data 86. Notably, the user 18 now has an additional view of the virtual environment based on real-time input provided by the user 84 at a device that is communicatively coupled to the device 12.

The user 84 may also provide updated real-time information that alters the observer view 96. For example, the user 84 may provide real-time input that includes a second observer view location identifier that identifies a second location in the virtual environment that differs from the location identified by the observer view location ID 88. The observer view data 86 may be updated with the second observer view location identifier, and any other updated information. The simulation module 16 then alters the observer view 96 based on the second observer view location identifier to generate altered observer view imagery 98. The altered observer view imagery 98 depicts a second portion of the virtual environment based on the updated observer view data 86.

The user 18, or the user 84, may also provide real-time input to generate one or more additional observer views. For example, the user 18 may provide real-time input to the external application 44 that may include observer view data 99 such as an observer view location identifier that identifies a location within the virtual environment, a view direction identifier that identifies a view direction in the virtual environment, a horizontal FOV identifier that identifies a horizontal FOV, and a vertical FOV identifier that identifies a vertical FOV. The external application 44 may provide the observer view data 99 to the API 46 of the simulation module 16. The simulation module 16, in response to receiving the observer view data 99, generates an observer view 100 based on the observer view data 99 received from the external application 44. The simulation module 16 may then generate observer view imagery 104 that depicts a portion of the virtual environment based on the observer view data 99. Note that the observer view imagery 104 may depict a different portion of the virtual environment than both the observer view imagery 98 and the core view imagery 36. Thus, the simulation module 16 may receive, during the simulation, a plurality of different real-time inputs, each different real-time input including corresponding observer view data that identifies a corresponding observer view in the virtual environment. Each corresponding observer view may be different from each other corresponding observer view and may be different from the core view. While for purposes of illustration only two observer views are discussed, the user 18 or user 84 may be able to establish any number of observer views for presentation on the display device 14. As the number of observer views increases, the size of the windows, such as the windows 38, 50, 54, and any additional windows, may decrease to fit the additional observer views in the area available on the display device 14.

Figure 6:
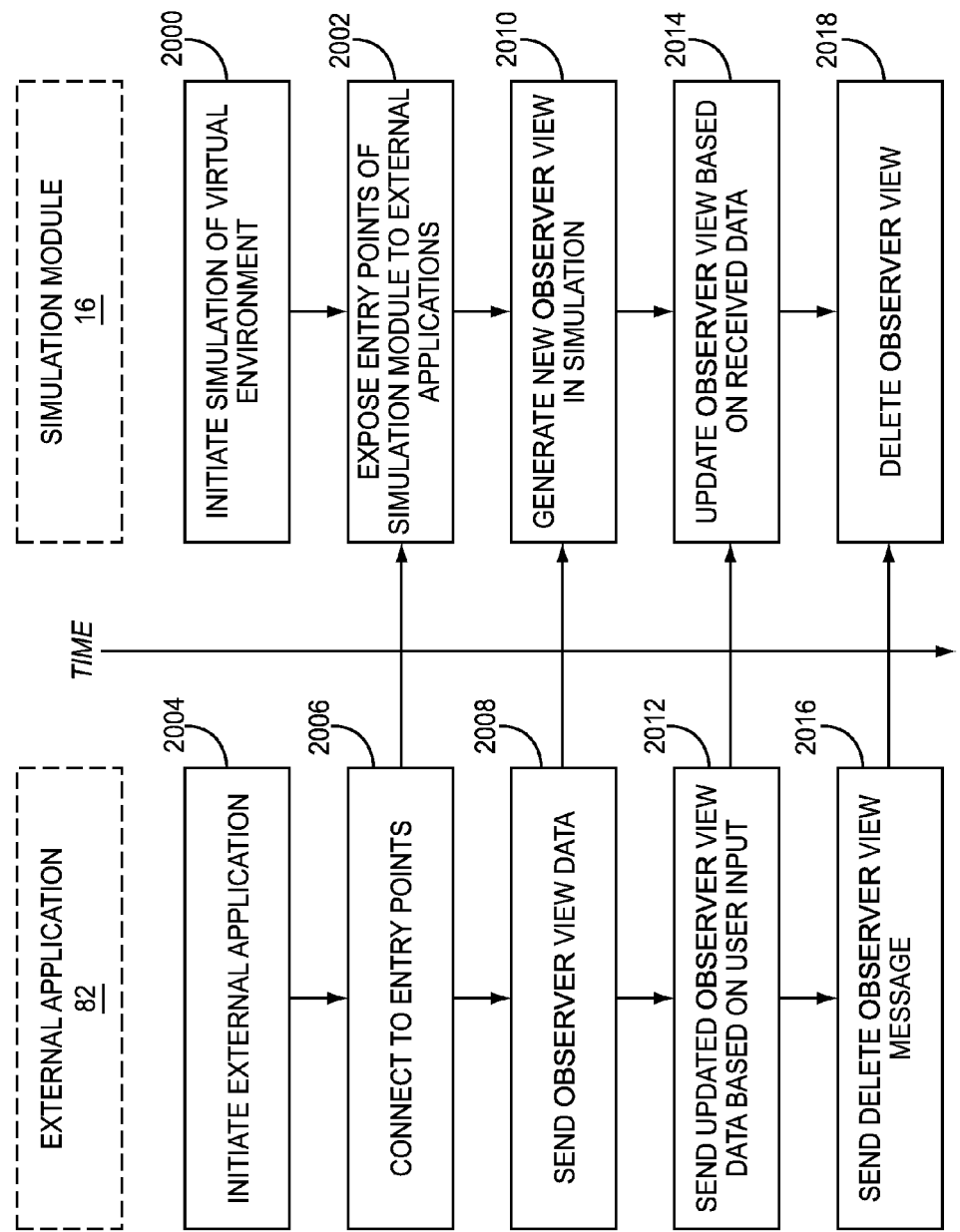
FIG. 6 is a flowchart illustrating parallel processing of a simulation module and an external application according to one embodiment.

FIG. 6 is a flowchart illustrating parallel processing of the simulation module 16 and the external application 82 according to one embodiment. FIG. 6 will be discussed in conjunction with FIG. 5. Initially, the simulation module 16 may initialize in order to provide a simulation of the virtual environment (FIG. 6, block 2000). In conjunction with the initiation of the simulation module 16, the simulation module 16 may expose entry points of the simulation module 16, such as via the API 46, to external applications (FIG. 6, block 2002). At some later point in time the external application 82 may initiate on the device 80 (FIG. 6, block 2004). The external application 82 may connect to the entry points of the API 46 (FIG. 6, block 2006). The external application 82, perhaps in response to real-time input from the user 84, may send observer view data 86 to the simulation module 16 via the API 46 (FIG. 6, block 2008). In response to receiving the observer view data 86, the simulation module 16 may generate the observer view 96 (FIG. 6, block 2010). During the simulation, the external application 82 may send updated observer view data 86 based on user input from the user 84 (FIG. 6, block 2012). The simulation module 16 may receive the updated observer view data 86 and update the observer view 96 based on the received updated observer view data 86 (FIG. 6, block 2014). The simulation module 16 continually updates the observer view imagery 98 based on the current state of the observer view data 86. The process described with respect to blocks 2012 and 2014 may occur repeatedly over a period of time during the simulation. At some point in time, the external application 82 may send a delete observer view message to the simulation module 16 (FIG. 6, block 2016). In response to receiving the delete observer view message, the simulation module 16 deletes the observer view 96 (FIG. 6, block 2018).

Figure 7:
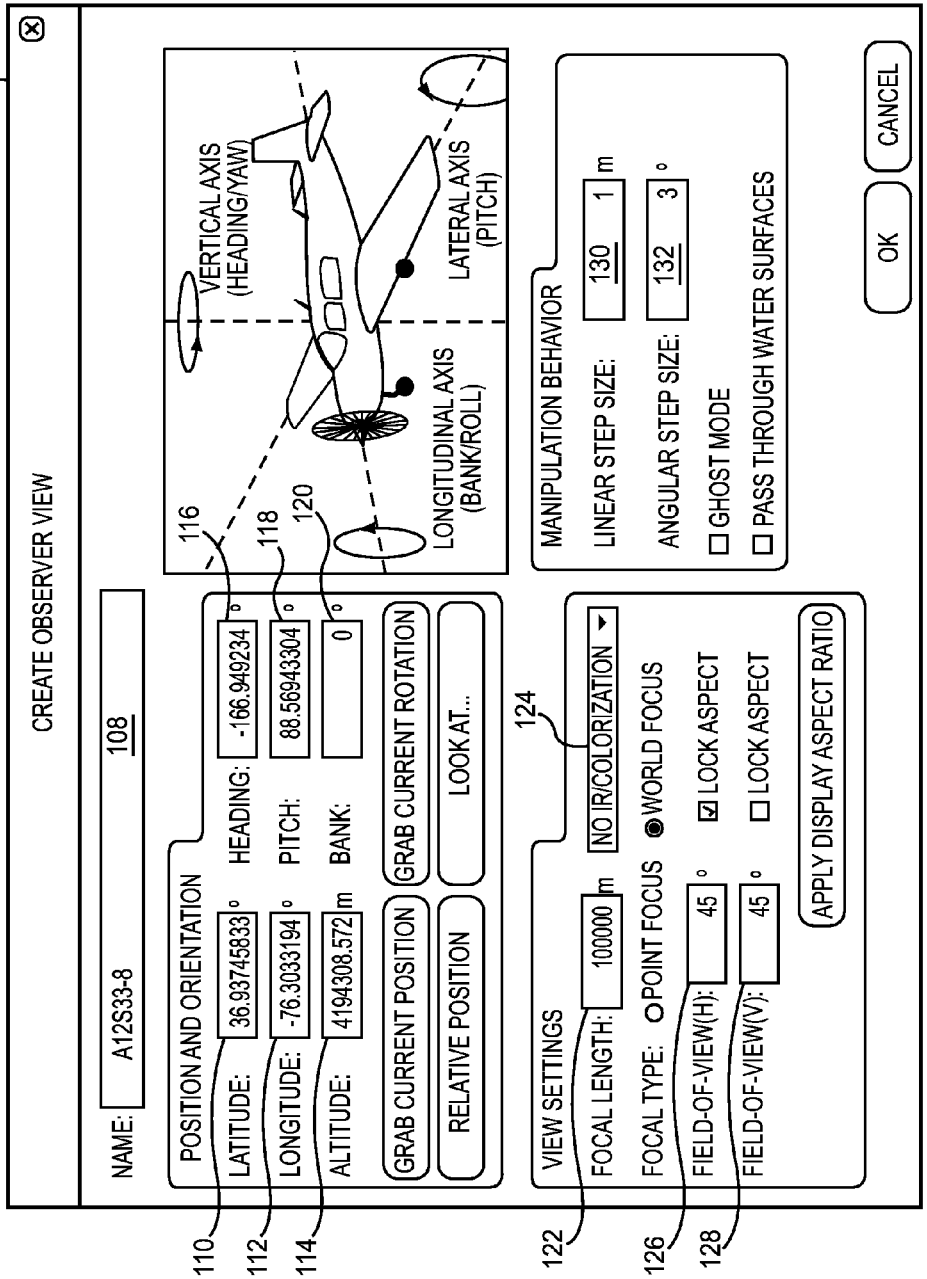
FIG. 7 is a diagram of a user interface via which a user may enter observer view data according to one embodiment.

FIG. 7 is a diagram of a user interface 106 via which a user may enter observer view data for defining an observer view according to one embodiment. FIG. 7 will be discussed in conjunction with FIG. 5. The user interface 106 may be offered by one or more of the simulation module 16, the external application 44, or the external application 82. The user interface 106 may include an observer view name field 108 via which a user can provide a name to which the observer view may be referred. Latitude, longitude, and altitude fields 110, 112, and 114 may allow the user to provide a location of the observer view, and thus, collectively may comprise an observer view location identifier that identifies a location of the observer view within the virtual environment. Heading, pitch, and bank fields 116, 118, and 120 may allow the user to provide a direction, or orientation, in the virtual environment with respect to the location identified by the latitude, longitude, and altitude fields 110, 112, and 114, and thus, collectively comprise a view direction identifier that identifies a view direction in the virtual environment with respect to the location.

A focal length field 122 may allow the user to provide a particular focal length of the observer view. A drop down list 124 may allow the user to select a particular type of observer view imagery from a list of potential types of observer view imagery that could be generated, such as infrared (IR) imagery, non-IR imagery, colored imagery, black and white imagery, and the like. A horizontal FOV field 126 may allow the user to define a desired horizontal FOV identifier that identifies a desired horizontal FOV. A vertical FOV field 128 may allow the user to define a desired vertical FOV identifier that identifies a desired vertical FOV. In some embodiments, particular manipulations of an input device by the user, such as the depression of a particular key on a keyboard, may be translated as a movement of the observer view in the virtual environment. A linear step size field 130 may allow the user to identify, for each such discrete manipulation by the user, an amount of movement of the observer view in the virtual environment. Thus, for purposes of illustration, assume that an "Up Arrow" key on an input keyboard is mapped to a forward linear movement of the observer view in the virtual environment, and a "Down Arrow" key is mapped to a reverse linear movement of the observer view in the virtual environment. In this example, a single depression of the Up Arrow key by the user would translate into a 1 meter forward movement of the observer view in the virtual environment. Thus, repeated depressions of the Up Arrow key would result in successive 1 meter forward movements of the observer view. A single depression of the Down Arrow key by the user would translate into a 1 meter reverse movement of the observer view in the virtual environment. Thus, repeated depressions of the Down Arrow key would result in successive 1 meter reverse movements of the observer view.

An angular step size field 132 may allow the user to identify, for each such discrete manipulation by the user, an amount of angular movement of the observer view in the virtual environment. Assume further for purposes of illustration that a "Left Arrow" key is mapped to a left angular movement of the observer view in the virtual environment, and a "Right Arrow" key is mapped to a right angular movement of the observer view in the virtual environment. In this example, a single depression of the Left Arrow key by the user would translate into a 3 degree rotation of the observer view to the left. Repeated depressions of the Left Arrow key would result in successive 3 degree rotations of the observer view to the left. A single depression of the Right Arrow key by the user would translate into a 3 degree rotation of the observer view to the right. Repeated depressions of the Right Arrow key would result in successive 3 degree rotations of the observer view to the right.

While for purposes of illustration particular keys on a keyboard have been discussed as being associated with movements of the observer view within the virtual environment, it will be understood that any keys may be mapped to a desired movement or rotation of the observer view within the virtual environment, and indeed any input device, such as a mouse, a joystick, a wireless motion controller comprising an accelerometer, or the like, may be used to manipulate the observer view within the virtual environment.

Figure 8:
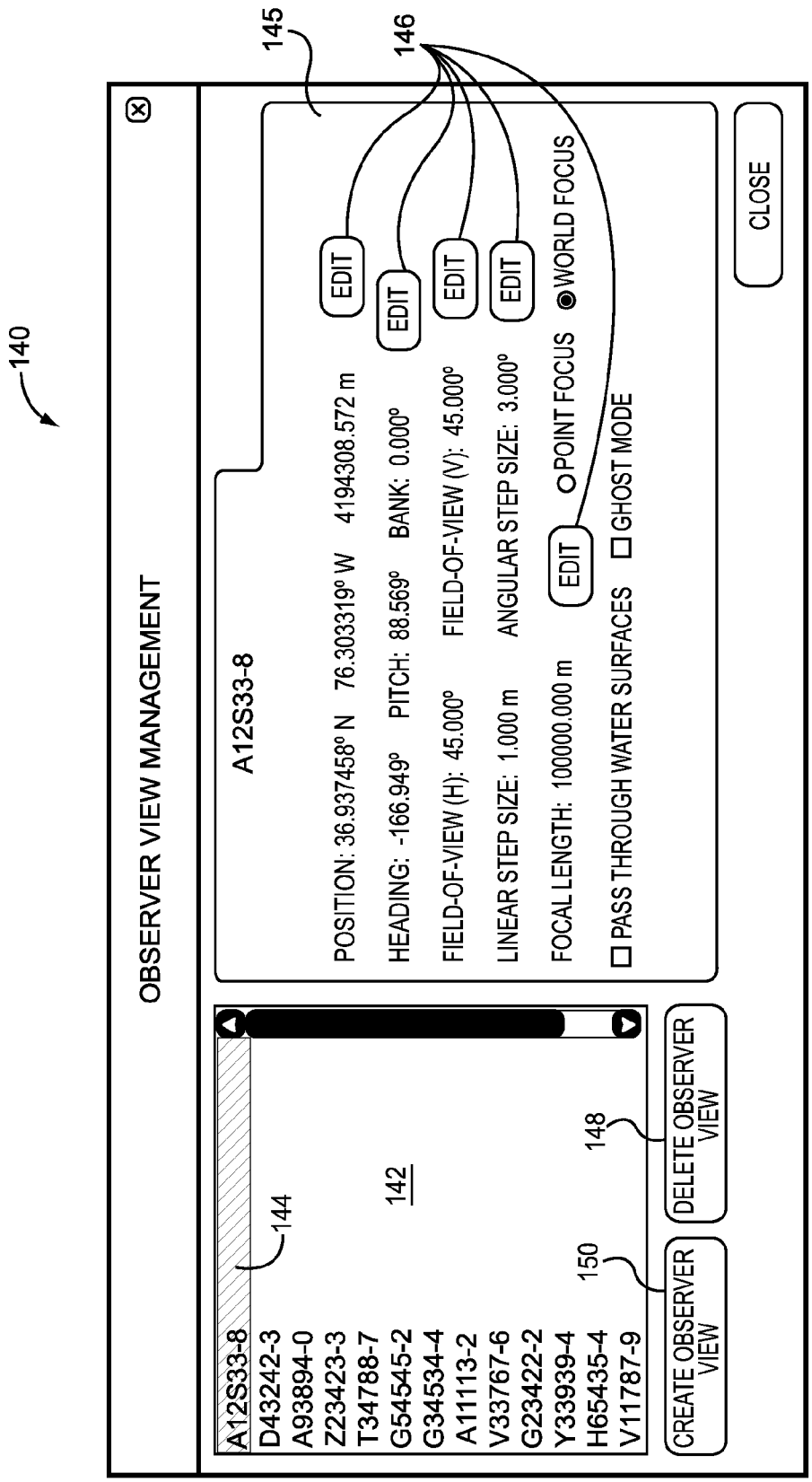
FIG. 8 is a diagram of an observer view management user interface which may be used by a user to manage multiple observer views that have been established in the virtual environment according to one embodiment.

As mentioned previously, any number of observer views in the virtual environment may be established. FIG. 8 is a diagram of an observer view management user interface 140 which may be used by a user to manage multiple observer views that have been established in the virtual environment according to one embodiment. The user interface 140 may be offered by one or more of the simulation module 16, the external application 44, or the external application 82. A scroll list 142 may allow the user to scroll through multiple observer views based on observer view names provided, for example, by a user in the observer view name field 108 (FIG. 7) when establishing the respective observer view. Assume for purposes of illustration that the user has selected the observer view identified by a particular observer view name 144. Upon selection of the particular observer view name 144, the observer view management user interface 140 may provide in an observer view data area 145 attributes of the selected observer view, such as the current position, or location, of the observer view in the virtual environment, the current heading, or direction, of the observer view in the virtual environment, the current horizontal and vertical FOVs, respectively, the linear and angular step sizes, focal length, and the like. The user may edit any one more of these attributes by selecting respective Edit buttons 146 that are located adjacent to such information.

The user may be able to delete one or more observer views by selecting a particular observer view name identified in the scroll list 142, and activating a Delete Observer View button 148. If the observer view management user interface 140 is being offered by an external application, upon receipt of the selection of the Delete Observer View button 148, the observer view management user interface 140 may generate a delete observer view message identifying the respective observer view, and send the delete observer view message to the simulation module 16. The simulation module 16 may then delete the respective observer view.

The user may also be able to create one or more observer views by selecting a Create Observer View button 150. Upon selecting the Create Observer View button 150, an additional user interface window, such as the user interface 106 illustrated in FIG. 7 may be provided to the user to allow the user to create a new observer view in the virtual environment.

Figure 9:
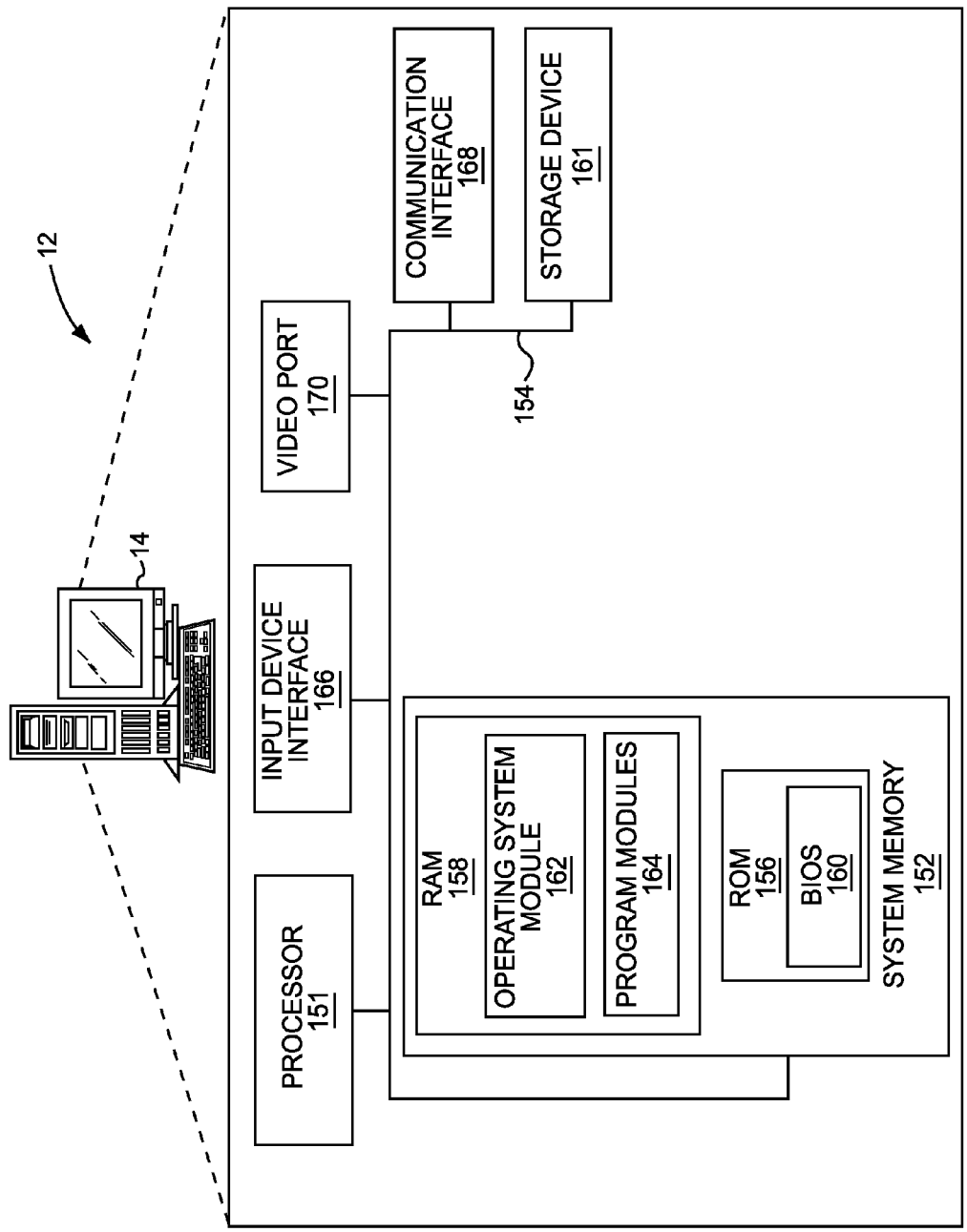
FIG. 9 is a block diagram of a device according to one embodiment.

FIG. 9 is a block diagram of a device 12 according to one embodiment. The device 12 may comprise any computing or processing device capable of executing software instructions to implement the functionality described herein, such as a work station, a desktop or laptop computer, a tablet computer, or the like. The device 12 includes a processor 151, a system memory 152, and a system bus 154. The system bus 154 provides an interface for system components including, but not limited to, the system memory 152 and the processor 151. The processor 151 can be any commercially available or proprietary processor. Dual microprocessors and other multi-processor architectures may also be employed as the processor 151.

The system bus 154 may be any of several types of bus structures that may further interconnect to a memory bus (with or without a memory controller), a peripheral bus, and/or a local bus using any of a variety of commercially available bus architectures. The system memory 152 may include non-volatile memory 156 (e.g., read only memory (ROM), erasable programmable read only memory (EPROM), electrically erasable programmable read only memory (EEPROM), etc.) and/or volatile memory 158 (e.g., random access memory (RAM)). A basic input/output system (BIOS) 160 may be stored in the non-volatile memory 156, and can include the basic routines that help to transfer information between elements within the device 12. The volatile memory 158 may also include a high-speed RAM, such as static RAM, for caching data.

The device 12 may further include a computer-readable storage device 161, which may comprise, for example, an internal hard disk drive (HDD) (for example, an enhanced integrated drive electronics (EIDE) HDD or serial advanced technology attachment (SATA) HDD), a flash memory, or the like. The computer-readable storage device 161 and other drives, sometimes referred to as computer-readable or computer-usable media, provide non-volatile storage of data, data structures, computer-executable instructions, and the like. Although for purposes of illustration the description of the computer-readable storage device 161 above refers to a HDD, it should be appreciated by those skilled in the art that other types of media which are readable by a computer, such as Zip disks, magnetic cassettes, flash memory cards, cartridges, and the like, may also be used in the operating environment, and further, that any such media may contain computer-executable instructions for performing novel functionality as disclosed herein.

A number of modules can be stored in the computer-readable storage device 161 and in the volatile memory 158, including an operating system module 162 and one or more program modules 164, which may implement the functionality described herein in whole or in part, including, for example, functionality associated with the simulation module 16, the API 46, and the external application 44. It is to be appreciated that the embodiments can be implemented with various commercially available operating system modules 162 or combinations of operating system modules 162.

All or a portion of the embodiments may be implemented as a computer program product stored on a non-transitory computer-usable or computer-readable storage medium, such as the computer-readable storage device 161, which includes complex programming instructions, such as complex computer-readable program code, configured to cause the processor 151 to carry out the functionality described herein. Thus, the computer-readable program code can comprise software instructions for implementing the functionality of the embodiments described herein when executed on the processor 151. The processor 151, in conjunction with the program modules 164 in the volatile memory 158, may serve as a control system for the device 12 that is configured to, or adapted to, implement the functionality described herein.

A user may be able to enter commands and information into the device 12 through one or more input devices, such as, for example, a keyboard (not illustrated), a pointing device such as a mouse (not illustrated), a touch-sensitive surface (not illustrated), or the like. Other input devices may include a microphone, an infrared (IR) remote control, a joystick, a game pad, a stylus pen, or the like. These and other input devices may be connected to the processor 151 through an input device interface 166 that is coupled to the system bus 154, but can be connected by other interfaces such as a parallel port, an Institute of Electrical and Electronic Engineers (IEEE) 1394 serial port, a Universal Serial Bus (USB) port, an IR interface, and the like.

The device 12 may also include a communication interface 168 suitable for communicating with the network 22. The device 12 may also include a video port 170 interfacing with the display device 14 that provides information to the user 18.

Those skilled in the art will recognize improvements and modifications to the embodiments. All such improvements and modifications are considered within the scope of the concepts disclosed herein and the claims that follow.

What is claimed is:

1. A method, comprising:
   initiating, by a first device comprising a processor, a simulation of a virtual environment;
   maintaining, by the first device, core view data that identifies a core view in the virtual environment, the core view being associated with an object in the virtual environment, the object corresponding to a user who is participating in the simulation;
   generating, by the first device, core view imagery that depicts a portion of the virtual environment based on the core view data;
   receiving, during the simulation, a plurality of different real-time inputs, each different real-time input including corresponding observer view data that identifies a corresponding observer view of a plurality of observer views in the virtual environment that did not previously exist, each corresponding observer view being unassociated with any object in the virtual environment;
   in response to receiving the plurality of different real-time inputs, generating the plurality of observer views in the simulation;
   generating a plurality of observer view imagery, each observer view imagery of the plurality of observer view imagery corresponding to one of the plurality of observer views and depicting a different portion of the virtual environment based on the corresponding observer view data; and
   presenting concurrently, on a display device being viewed by the user, each observer view imagery in a corresponding separate observer view window, and the core view imagery in a core view window.

2. The method of claim 1, wherein the simulation is provided at least in part by a simulation module executing on the first device, and further comprising:
   exposing, by the simulation module, an application programming interface (API) configured to receive data for generating an observer view from an external application that is independent of and external to the simulation module; and
   wherein receiving, during the simulation, the plurality of different real-time inputs comprises receiving via the API from the external application the plurality of different real-time inputs.

3. The method of claim 2, further comprising altering a first observer view of the plurality of observer views based on updated real-time input received via the API from the external application.

4. The method of claim 2, wherein the external application executes on a second device that is communicatively coupled to the first device.

5. The method of claim 2, wherein first observer view data that identifies a first observer view of the plurality of observer views comprises a first observer view location identifier that identifies a first location within the virtual environment.

6. The method of claim 5, further comprising:
   receiving updated real-time input that includes a second observer view location identifier that identifies a second location within the virtual environment, the second location differing from the first location;
   in response to receiving the second observer view location identifier, altering the first observer view based on the second observer view location identifier to generate an altered first observer view; and
   generating new first observer view imagery that depicts a second portion of the virtual environment based on the second observer view location identifier.

7. The method of claim 1, wherein first observer view data that identifies a first observer view of the plurality of observer views comprises a first observer view location identifier that identifies a location within the virtual environment, a view direction identifier that identifies a view direction in the virtual environment with respect to the location, and a field-of-view identifier that identifies a field-of-view.

8. The method of claim 1, wherein a location identified by a first observer view location identifier is a location in the virtual environment that is within the portion of the virtual environment based on the core view data, and wherein the core view imagery does not depict the first observer view.

9. A device, comprising:
   a communication interface configured to communicate with a network; and
   a processor coupled to the communication interface, and configured to:
   initiate a simulation of a virtual environment;
   maintain core view data that identifies a core view in the virtual environment, the core view being associated with an object in the virtual environment, the object corresponding to a user who is participating in the simulation;

generate core view imagery that depicts a portion of the virtual environment based on the core view data;

receive, during the simulation, a plurality of different real-time inputs, each different real-time input including corresponding observer view data that identifies a corresponding observer view of a plurality of observer views in the virtual environment that did not previously exist, each corresponding observer view being unassociated with any object in the virtual environment;

in response to receiving the plurality of different real-time inputs, generate the plurality of observer views in the simulation; and generate a plurality of observer view imagery, each observer view imagery of the plurality of observer view imagery corresponding to one of the plurality of observer views and depicting a different portion of the virtual environment based on the corresponding observer view data; and present concurrently, on a display device viewable by the user, each observer view imagery in a corresponding separate observer view window, and the core view imagery in a core view window.

10. The device of claim 9, further comprising:

a simulation module configured to expose, by the simulation module, an application programming interface (API) configured to receive data for generating an observer view from an external application that is independent of and external to the simulation module; and wherein to receive, during the simulation, the plurality of different real-time inputs, the processor is further configured to receive via the API from the external application the plurality of different real-time inputs.

11. The device of claim 10, wherein the processor is further configured to alter a first observer view of the plurality of observer views based on updated real-time input received via the API from the external application.

12. The device of claim 10, wherein the external application executes on a different device that is communicatively coupled to the device.

13. The device of claim 10, wherein a first observer view data that identifies a first observer view of the plurality of observer views comprises a first observer view location identifier that identifies a first location within the virtual environment.

14. The method of claim 1, further comprising:

presenting, on the display device, a user interface that allows a user to identify new observer view data for a new observer view;

receiving, via the user interface, the new observer view data;

in response to receiving the new observer view data, generating the new observer view;

generating new observer view imagery that corresponds to the new observer view; and presenting the new observer view data on the display device.

15. The method of claim 14, wherein the new observer view data comprises a position, a heading, and a field of view.

* * * * *